(12) United States Patent
Kim et al.

(10) Patent No.: US 12,055,857 B2
(45) Date of Patent: Aug. 6, 2024

(54) MASK PROCESSING APPARATUS AND SUBSTRATE PROCESSING APPARATUS

(71) Applicant: SEMES CO., LTD., Cheonan-si (KR)

(72) Inventors: Tae Hee Kim, Yongin-si (KR); Ji Hoon Jeong, Hwaseong-si (KR); Tae Shin Kim, Suwon-si (KR); Young Dae Chung, Incheon (KR); Young Eun Jeon, Ulsan (KR)

(73) Assignee: SEMES Co., Ltd.

( * ) Notice: Subject to any disclaimer, the term of this patent is extended or adjusted under 35 U.S.C. 154(b) by 0 days.

(21) Appl. No.: 18/147,469

(22) Filed: Dec. 28, 2022

(65) Prior Publication Data

US 2023/0213867 A1 Jul. 6, 2023

(30) Foreign Application Priority Data

Dec. 30, 2021 (KR) .................. 10-2021-0192282
Nov. 9, 2022 (KR) .................. 10-2022-0149032

(51) Int. Cl.
*G03F 7/00* (2006.01)

(52) U.S. Cl.
CPC ...... *G03F 7/70191* (2013.01); *G03F 7/70025* (2013.01)

(58) Field of Classification Search
CPC .... G03F 7/70191; G03F 7/70025; G03F 1/72; G03F 1/84
See application file for complete search history.

(56) References Cited

U.S. PATENT DOCUMENTS

| | | | |
|---|---|---|---|
| 9,274,433 B2 * | 3/2016 | Li | G03F 7/70075 |
| 9,274,434 B2 * | 3/2016 | Werber | G02B 26/0833 |
| 9,762,167 B2 * | 9/2017 | Ueda | G03F 7/70383 |
| 10,224,178 B2 * | 3/2019 | Jung | G03F 1/72 |
| 10,461,494 B2 * | 10/2019 | Kurosawa | G01N 33/004 |
| 11,464,116 B2 * | 10/2022 | Nagel | G03F 7/2053 |
| 2015/0116681 A1 | 4/2015 | Ueda | |
| 2018/0082820 A1 | 3/2018 | Jung et al. | |
| 2018/0351322 A1 | 12/2018 | Kurosawa et al. | |
| 2021/0168352 A1 * | 6/2021 | Silverstein | G02B 6/353 |
| 2022/0283512 A1 * | 9/2022 | Park | G03F 1/70 |

FOREIGN PATENT DOCUMENTS

| | | |
|---|---|---|
| JP | 11-202474 | 7/1999 |
| JP | 2009-21339 A | 1/2009 |
| KR | 101497763 B1 | 3/2015 |
| KR | 10-2020-0043767 A | 4/2020 |
| TW | 201901305 A | 1/2019 |

OTHER PUBLICATIONS

Japanese Office Action, dated Sep. 26, 2023, issued in Japanese Patent Application No. 2022-212313.
Taiwan Office Action, dated Oct. 20, 2023, issued in Taiwan Patent Application No. 11221046270.

* cited by examiner

*Primary Examiner* — Hung V Nguyen

(74) *Attorney, Agent, or Firm* — Harness, Dickey & Pierce, P.L.C.

(57) ABSTRACT

The inventive concept provides a mask treatment apparatus. The mask treatment may include a support unit that supports the mask, and a light irradiation unit that irradiate the mask with a light to adjust a critical dimension of a pattern formed in the mask, wherein the light irradiation unit includes a light source that generates the light, and a light modulation element that modulates the light generated by the light source and forms an irradiation pattern.

17 Claims, 15 Drawing Sheets

MASK PROCESSING APPARATUS AND SUBSTRATE PROCESSING APPARATUS

CROSS-REFERENCE TO RELATED APPLICATIONS

A claim for priority under 35 U.S.C. § 119 is made to Korean Patent Application No. 10-2021-0192282 filed on Dec. 30, 2021 and Korean Patent Application No. 10-2022-0149032 filed on Nov. 9, 2022, in the Korean Intellectual Property Office, the entire contents of which are hereby incorporated by reference.

BACKGROUND

Embodiments of the inventive concept described herein relate to a mask treatment apparatus and a substrate treatment apparatus.

To manufacture a semiconductor element, various processes such as photography, etching, ashing, ion implantation, and thin film deposition are performed on substrates such as wafers. Various treatment liquids and treatment gases are used in the processes. Further, to remove the treatment liquid used to treat the substrate, a drying process is performed on the substrate.

The photographic process for forming a pattern on a wafer includes an exposure process. The exposure process is a process for cutting a semiconductor-integrated material attached to the wafer into a desired pattern. The exposure process may have various purposes such as forming a pattern for etching and forming a pattern for ion implantation. In the exposure process, a pattern is drawn with light on the wafer using a mask that is a kind of "frame." When a semiconductor-integrated material on the wafer, for example, a resist on the wafer, is exposed to light, chemical properties of the resist are changed according to the pattern by the light and the mask. When a developing solution is supplied to the resist of which the chemical properties are changed according to the pattern, the pattern is formed on the wafer.

To precisely perform the exposure process, the pattern formed on the mask should be precisely manufactured. In some cases, a critical dimension of the pattern formed on the mask should be adjusted. When the critical dimension of the pattern does not have a desired size, a method of manufacturing a new mask may be considered, but this is not appropriate because a price of one mask is very high. Thus, it is necessary to additionally process the mask to adjust the critical dimension of the pattern formed on the mask.

FIG. 1 is a view illustrating a state in which a pattern is drawn on a wafer using deep ultraviolet (DUV) light. In the related art, the DUV mask used to draw the pattern on the wafer using the DUV light is configured such that the DUV light may pass therethrough. Thus, to adjust the critical dimension of the pattern formed on the DUV mask, the critical dimension of the pattern may be adjusted by irradiating the pattern on the DUV mask or a region around the pattern with a laser beam. For example, to increase the critical dimension of the pattern, the pattern may be irradiated with a laser beam. Further, to decrease the critical dimension of the pattern, a crack may be formed in the region around the pattern by irradiating the region around the pattern with a laser beam. When the crack is formed in the region around the pattern, the region around the pattern is thermally expanded, and thus the critical dimension of the pattern may be reduced. However, it is difficult to apply the method of adjusting the critical dimension of the pattern to an extreme ultraviolet (EUV) mask.

FIG. 2 is a view illustrating a state in which the pattern is drawn on the wafer using EUV light. Referring to FIG. 2, unlike the DUV mask, the EUV mask draws the pattern on the wafer in a manner of reflecting the EUV light. A wavelength of the EUV light is very shorter than a wavelength of the DUV light. Thus, the EUV light is absorbed to the mask without passing through the mask. Thus, the EUV mask draws the pattern on the wafer in a manner of reflecting the EUV light. For this reason, it is difficult to apply, to the EUV mask, a manner of adjusting the critical dimension of the make by simply irradiating the pattern on the mask or the region around the pattern with a laser beam.

SUMMARY

Embodiments of the inventive concept provide a mask treatment apparatus and a substrate treatment apparatus capable of effectively treating a mask.

Embodiments of the inventive concept also provide a mask treatment apparatus and a substrate treatment apparatus capable of effectively adjusting a critical dimension of a pattern formed in the mask.

The problem to be solved by the inventive concept is not limited to the above-described problems, and not-mentioned problems will be clearly understood by those skilled in the art to which the inventive concept pertains from the present specification and the accompanying drawings.

The inventive concept provides a mask treatment apparatus. According to an embodiment, a mask treatment apparatus includes a support unit that supports a mask, and a light irradiation unit that irradiates the mask with a light to adjust a critical dimension of a pattern formed in the mask, wherein the light irradiation unit includes a light source that generates the light, and a light modulation element that modulates the light generated by the light source and forms an irradiation pattern.

According to an embodiment, the light modulation element may include micromirrors rotatably provided, and an element substrate in which the micromirrors are installed.

According to an embodiment, the light irradiation unit may further include a light dumper that removes a light of which a reflection direction is changed by the micromirror and which is thus not transmitted to the mask.

According to an embodiment, the light dumper may have a hollow cylindrical shape and have a hole through which the light modulated by the light modulation element passes.

According to an embodiment, at least a portion of an inner surface of the light dumper may include a groove that removes the light of which the reflection direction is changed by the micromirrors and which is thus not transferred to the mask.

According to an embodiment, the light irradiation unit may further include a cooling mechanism that cools the light dumper.

According to an embodiment, the mask treatment apparatus may further include an irradiation position change mechanism that changes an irradiation position of the light modulated by the light modulation element, wherein the irradiation position change mechanism includes a rotational driver, and a rotational mirror that is coupled to the rotational driver and is rotatable.

According to an embodiment, the plurality of rotational drivers may be provided and the plurality of rotational mirrors may be provided, and a rotary shaft of any one of the rotational mirrors and a rotary shaft of another one of the rotational mirrors are not parallel to each other.

According to an embodiment, the mask treatment apparatus may further include an F-Theta lens that is installed between the irradiation position change mechanism and the support unit and refracts the light traveling obliquely by the irradiation position change mechanism in a vertical direction.

According to an embodiment, the mask treatment apparatus may further include a controller that controls the light irradiation unit, wherein the controller controls the light modulation element to form an irradiation pattern required in each of a plurality of regions of the mask requiring irradiation of the light and randomly determines an irradiation sequence of the plurality of regions.

Further, the inventive concept provides a substrate treatment apparatus. According to an embodiment, a substrate treatment apparatus includes a support unit that supports a substrate, a chemical liquid supply unit that supplies a chemical liquid to the substrate supported by the support unit, and a laser beam irradiation unit that irradiates the substrate supported by the support unit with a laser beam, wherein the laser beam irradiation unit includes a laser beam source that generates the laser beam, and a digital micro-mirror device (DMD) element that modulates the laser beam generated by the laser beam source so as to form an irradiation pattern.

According to an embodiment, the substrate treatment apparatus may further include a bowl that defines a treatment space in which the substrate is treated, the support unit supporting the substrate in the treatment space.

According to an embodiment, the substrate treatment apparatus may further include a controller that controls the laser beam irradiation unit, wherein the controller controls the laser beam irradiation unit so that the DMD element forms a first irradiation pattern when a first region of the substrate is irradiated with the laser beam and the DMD element forms a second irradiation pattern when a second region of the substrate different from the first region is irradiated with the laser beam.

According to an embodiment, the substrate treatment apparatus may further include a controller that controls the laser beam irradiation unit, wherein the controller controls the laser beam irradiation unit to randomly determine an irradiation sequence of a plurality of regions of the substrate requiring irradiation of the laser beam and irradiate the substrate with the laser beam according to the determined irradiation sequence.

According to an embodiment, the substrate treatment apparatus may further include an irradiation position change mechanism that changes an irradiation position of the laser beam modulated by the DMD element, wherein the support unit maintains a horizontal position of the substrate in a fixed state while the substrate is irradiated with the laser beam and/or while the irradiation position of the laser beam is changed.

According to an embodiment, the substrate treatment apparatus may further include a controller that controls the chemical liquid supply unit and the laser beam irradiation unit, wherein the controller controls the chemical liquid supply unit and the laser beam irradiation unit so that the chemical liquid supply unit supplies the chemical liquid to the substrate supported by the support unit to form a liquid film, and the laser beam irradiation unit irradiates the substrate on which the liquid film is formed with the laser beam.

According to an embodiment, the substrate treatment apparatus may further include a flat top optical mechanism that converts the laser beam emitted by the laser beam source and having a Gaussian shape into a laser beam having a flat top shape.

According to an embodiment, the DMD element may modulate the laser beam by maintaining a width of the laser beam generated by the laser beam source or reducing the width of the laser beam.

Further, the inventive concept provides a mask treatment apparatus for treating an extreme ultraviolet (EUV) mask that reflects EUV light to form a pattern on a substrate. According to an embodiment, a mask treatment apparatus includes a support unit that supports a mask, a liquid supply unit that supplies a chemical liquid that is an etchant to the mask, and a laser beam irradiation unit that irradiates, with a laser beam, the mask in which a liquid film is formed by the chemical liquid supplied by the liquid supply unit, and adjusts a critical dimension of a pattern formed in the mask, wherein the laser beam irradiation unit includes a laser beam source that generates a laser beam having a Gaussian shape, a digital micro-mirror device (DMD) element that modulates the laser beam generated by the laser beam source to form an irradiation pattern, a laser beam dumper that removes a laser beam of which a reflection direction is changed by the DMD element and which is thus not irradiated to the substrate, a hole through which the laser beam modulated by the DMD element passes being formed in the laser beam dumper, and a plurality of grooves that removes the laser beam not irradiated to the substrate being formed in an inner surface of the laser beam dumper, a flat top optical mechanism installed between the laser beam source and the DMD element and that converts the laser beam having a Gaussian shape into a laser beam having a flat top shape, an irradiation position change mechanism that is a Galvano scanner that changes a position at which the mask is irradiated with the laser beam modulated by the DMD element, and an F-Theta lens positioned between the irradiation position change mechanism and the support unit and that changes a traveling direction of the laser beam passing through the irradiation position change mechanism in a vertical direction.

According to an embodiment, the mask treatment apparatus may further include a controller that controls the laser beam irradiation unit and the chemical liquid supply unit, wherein the controller performs controlling the chemical liquid supply unit so that the chemical liquid supply unit supplies a chemical liquid to the mask supported by the support unit to form the liquid film, randomly determining, by the controller, an irradiation sequence of the laser beam for a plurality of regions of the mask requiring irradiation of the laser beam, controlling the DMD element so that the DMD element forms an irradiation pattern corresponding to a region, which is to be irradiated with the laser beam, among the plurality of regions, and irradiating the mask with the laser beam according to the formed irradiation pattern and the irradiation sequence.

Further, the inventive concept provides a mask treatment method. According to an embodiment, a mask treatment method includes a mask inspection operation of mapping regions requiring adjustment of a critical dimension of a pattern formed in the mask through vision inspection, a chemical liquid supply operation of supplying a chemical liquid to the mask to form a liquid film, and a light irradiation operation of irradiating the regions requiring the adjustment of the critical dimension of the mask on which the liquid film is formed with a laser beam through which an irradiation pattern is formed by a light modulation element.

According to an embodiment, the mask treatment method may further include an alignment operation of aligning at least one of a position at which the mask is placed on the support unit, a direction in which the mask is placed on the support unit, and a position irradiated with the laser beam.

According to an embodiment, the alignment operation may be performed before the light irradiation operation.

According to an embodiment, in the alignment operation, the position at which the mask is placed on the support unit and the direction in which the mask is placed on the support unit may be identified by capturing an image of an alignment mark displayed on the mask through a vision sensor.

According to an embodiment, in the alignment operation, the position irradiated with the laser beam may be identified by positioning an alignment plate below a Galvano scanner that changes an irradiation position of the laser beam, irradiating the alignment plate with the laser beam, and capturing an image of the alignment plate using a vision sensor.

According to an embodiment, a horizontal position and a vertical position of the mask may be maintained in a fixed state during the light irradiation operation.

According to an embodiment, an irradiation sequence of the regions requiring the adjustment of the critical dimension may be determined, and the irradiation sequence may be randomly determined regardless of positions of the regions.

According to an embodiment, the laser beam may be converted from a Gaussian shape into a flat top shape, and the laser beam converted into the flat top shape may be modulated by the light modulation element to form the irradiation pattern.

According to an embodiment, the light modulation element may modulate the laser beam by maintaining a width of the laser beam generated by the light source or reducing the width of the laser beam.

Further, the inventive concept provides a substrate treatment method. According to an embodiment, the substrate treatment method includes a substrate inspection operation of mapping regions requiring heating in the substrate through vision inspection, a chemical liquid supply operation of supplying a chemical liquid to the substrate to form a liquid film, and a laser beam irradiation operation of irradiating the substrate on which the liquid film is formed with a laser beam modulated by a digital micro-mirror device (DMD) element and having an irradiation pattern.

According to an embodiment, the substrate treatment method may further include an alignment operation of aligning at least one of a position in which the substrate is placed on a support unit, a direction in which the substrate is placed on the support unit, and a position irradiated with the laser beam.

According to an embodiment, an irradiation sequence for the regions requiring heating may be determined, and the irradiation sequence may be randomly determined.

According to an embodiment, the laser beam may be converted from a Gaussian shape into a flat top shape, and the laser beam converted into the flat top shape may be modulated by the DMD element to form the irradiation pattern.

According to an embodiment, the DMD element may form the irradiation pattern at each of the regions requiring heating.

According to an embodiment, the DMD element may modulate the laser beam by maintaining a width of the laser beam generated by a laser beam source or reducing the width of the laser beam.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
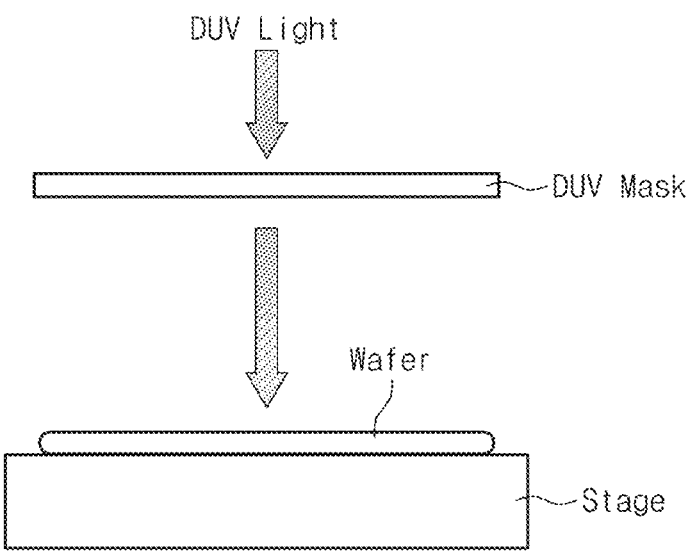
FIG. 1 is a view illustrating a state in which a pattern is drawn on a wafer using deep ultraviolet (DUV) light.
Figure 2:
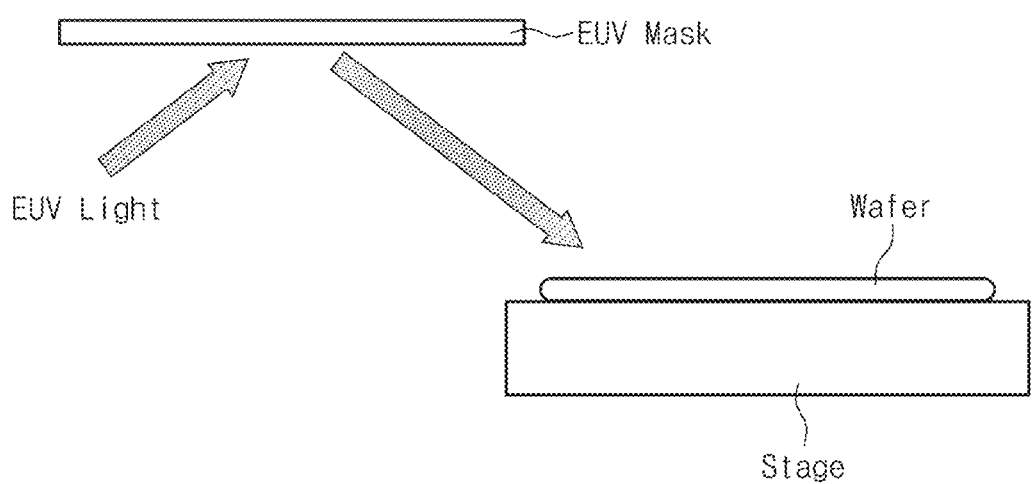
FIG. 2 is a view illustrating a state in which the pattern is drawn on the wafer using EUV light.

Hereinafter, embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Further, in a description of the embodiments of the inventive concept, a detailed description of related known functions or configurations will be omitted when they make the essence of the inventive concept unnecessarily unclear. In addition, the same reference numerals are used for parts that perform similar functions and operations throughout the drawings.

The expression of 'including' some elements may mean that another element may be further included without being excluded unless there is a particularly contradictory description. In detail, it will be understood that the terms "include", "comprise", "have", etc. specify the presence of features, numbers, steps, operations, elements, or components, described in the specification, or a combination thereof, and do not exclude in advance the presence or additional possibility of one or more other features, numbers, steps, operations, elements, or components or a combination thereof.

Singular expressions include plural expressions unless clearly otherwise indicated in the context. Further, in the drawings, the shapes and sizes of the elements may be exaggerated for clearer description.

The terms such as first and second may be used to describe various elements, but the elements are not limited to the terms. The terms may be used only for the purpose of distinguishing one element from another element. For example, while not deviating from the scope of the inventive concept, a first element may be named a second element, and similarly, the second element may be named the first element.

When it is mentioned that one element is "connected to" or "electrically connected to" another element, it should be understood that the first element may be directly connected or electrically connected to the second element but a third element may be provided therebetween. On the other hand, when it is mentioned that an element is "directly connected to" or "directly connected to" another element, it should be understood that a third element is not present between them. It should be construed that other expressions that describe the relationships between elements, such as "between", "directly between", "adjacent to", and "directly adjacent to" may have the same purpose.

In addition, unless defined otherwise, all terms used herein, including technical or scientific terms, have the same meanings as those generally understood by those skilled in the art to which the inventive concept pertains. The terms defined in the generally used dictionaries should be construed as having the meanings that coincide with the meanings of the contexts of the related technologies, and should not be construed as ideal or excessively formal meanings unless clearly defined in the specification of the inventive concept.

Hereinafter, embodiments of the inventive concept will be described with reference to FIGS. 3 to 19.

Figure 3:
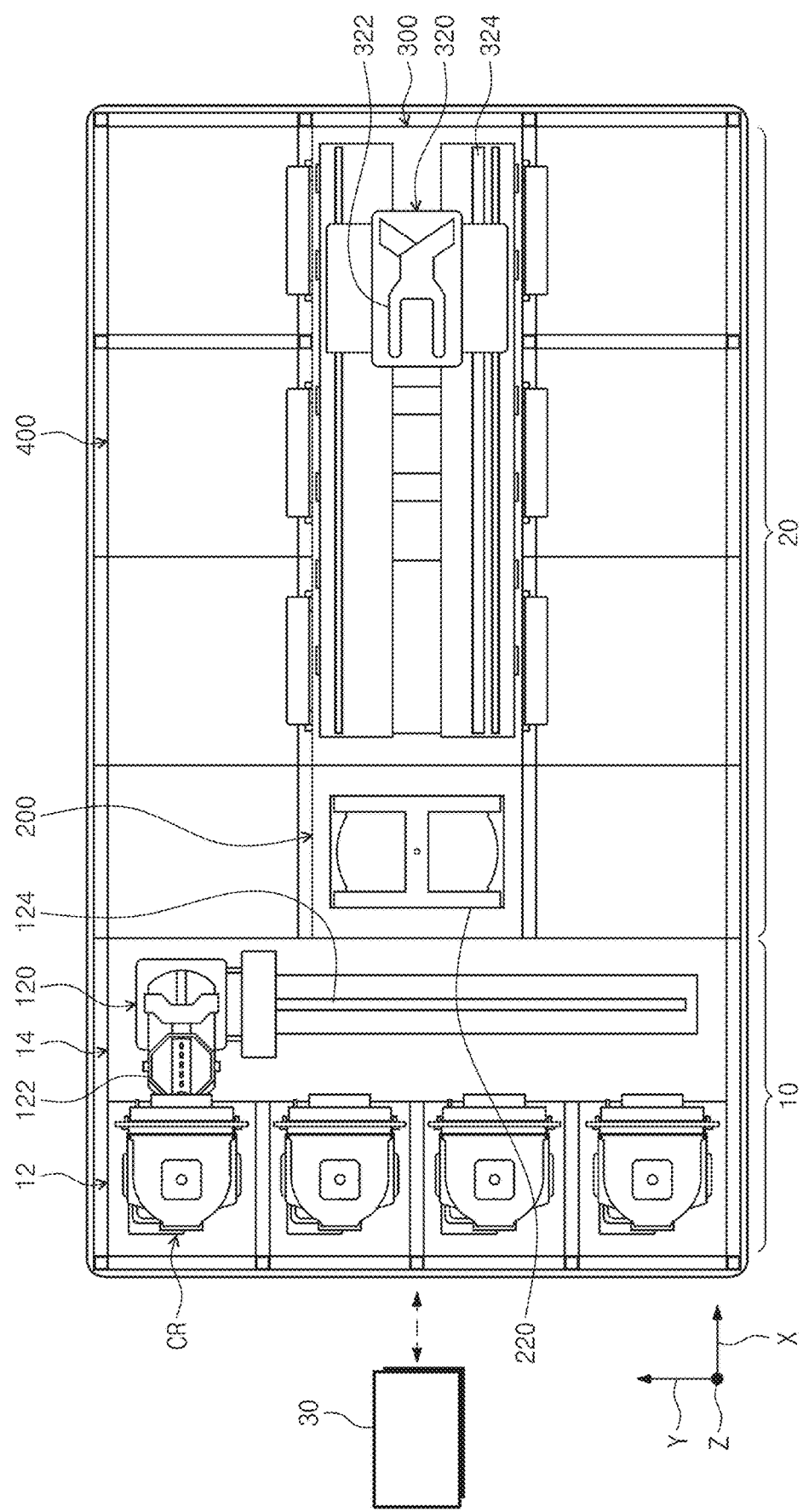
FIG. 3 is a plan view schematically illustrating a substrate treatment apparatus according to an embodiment of the inventive concept.

FIG. 3 is a plan view schematically illustrating a substrate treatment apparatus according to an embodiment of the inventive concept.

Referring to FIG. 3, the substrate treatment apparatus includes an index module 10, a treatment module 20, and a controller 30. When viewed from the top, the index module 10 and the treatment module 20 are arranged in one direction. Hereinafter, a direction in which the index module 10 and the treatment module 20 are arranged refers to a first direction "X", a direction that is perpendicular to the first direction "X" when viewed from the top refers to a second direction "Y", and a direction that is perpendicular to both the first direction "X" and the second direction "Y" refers to a third direction "Z".

The index module 10 transfers a substrate "M" to the treatment module 20 from a container CR in which the substrate "M" is accommodated and accommodates the substrate "M" completely treated by the treatment module 20 in the container CR. A lengthwise direction of the index module 10 is provided as the second direction "Y". The index module 10 has a load port 12 and an index frame 14. The load port 12 is located on a side opposite to the treatment module 20 with respect to the index frame 14. The container CR in which the substrates "M" are accommodated is placed on the load port 12. The load port 12 may be provided as a plurality of load ports 12, and the plurality of load ports 12 may be arranged in the second direction "Y".

A sealed container CR such as a front open unified pod (FOUP) may be used as the container CR. The container CR may be placed on the load port 12 by an operator or a transfer unit (not illustrated) such as an overhead transfer, an overhead conveyor, or an automatic guided vehicle.

An index robot 120 is provided in the index frame 14. A guide rail 124 having a lengthwise direction provided as the second direction "Y" may be provided in the index frame 14, and the index robot 120 may be provided to be movable on the guide rail 124. The index robot 120 may include a hand 122 on which the substrate "M" is placed, and the hand 122 may be provided to move forward or rearward, rotate using the third direction "Z" as an axis, and move in the third direction "Z". A plurality of hands 122 may be spaced apart from each other in the vertical direction, and the hands 122 may move forward or rearward independently of each other.

The controller 30 may control components of the substrate treatment apparatus. The controller 30 may include a process controller including a microprocessor (computer) that executes control of operation of the substrate treatment apparatus, a user interface including a keyboard for inputting commands to allow an operator to manage the substrate treatment apparatus and a display that visualizes and displays an operation situation of the substrate treatment apparatus, and a memory unit for storing a control program for executing processing executed by the substrate treatment apparatus under a control of the process controller or a program for executing processing in components according to various data and processing conditions, that is, a processing recipe. Further, the user interface and the memory unit may be connected to the process controller. The processing recipe may be stored in a memory medium of the memory unit, and the memory medium may be a hard disk, and may be a transportable disk such as a compact disc read-only memory (CD-ROM) and a digital versatile disc (DVD) and a semiconductor memory such as a flash memory.

The controller 30 may control the substrate treatment apparatus to perform the following substrate treatment method. For example, the controller 30 may control components provided in a liquid treatment chamber 400 to perform the following substrate treatment method.

The treatment module 20 includes a buffer unit 200, a transfer chamber 300, and the liquid treatment chamber 400. The buffer unit 200 provides a space in which the substrate "M" carried in the treatment module 20 and the substrate "M" carried out of the treatment module 20 stay temporarily. In the liquid treatment chamber 400, a liquid treatment process of supplying a liquid to the substrate "M" and liquid-treating the substrate "M" are performed. The transfer chamber 300 transfers the substrate "M" between the buffer unit 200, the liquid treatment chamber 400.

A lengthwise direction of the transfer chamber 300 may be provided as the first direction "X". The buffer unit 200 may be disposed between the index module 10 and the transfer chamber 300. The liquid treatment chamber 400 may be arranged on lateral sides of the transfer chamber 300.

The liquid treatment chamber 400 and the transfer chamber 300 may be arranged in the second direction "Y". The buffer unit 200 may be positioned at one end of the transfer chamber 300.

According to the embodiment, the liquid treatment chambers 400 may be arranged on both sides of the transfer chamber 300. The liquid treatment chambers 400 on one side of the transfer chamber 300 may be provided in an array of A X B (wherein, A and B are 1 or a natural number greater than 1) in the first direction "X" and the third direction "Z".

The transfer chamber 300 has a transfer robot 320. A guide rail 324 having a lengthwise direction provided as the first direction "X" may be provided in the transfer chamber 300, and the transfer robot 320 may be provided to be movable on the guide rail 324. The transfer robot 320 may include a hand 322 on which the substrate "M" is placed, and the hand 322 may be provided to move forward or rearward, rotate using the third direction "Z" as an axis, and move in the third direction "Z". A plurality of hands 322 may be spaced apart from each other in the vertical direction, and the hands 322 may move forward or rearward independently of each other.

The buffer unit 200 may be provided with a plurality of buffers 220 on which the substrate "M" is placed. The buffers 220 may be spaced apart from each other in the third direction "Z". A front face and a rear face of the buffer unit 200 are open. The front face is a surface facing the index module 10, and the rear face is a surface facing the transfer chamber 300. The index robot 120 may approach the buffer unit 200 through the front face, and the transfer robot 320 may approach the buffer unit 200 through the rear face.

Hereinafter, the substrate "M" treated in the liquid treatment chamber 400 will be described in detail.

Figure 4:
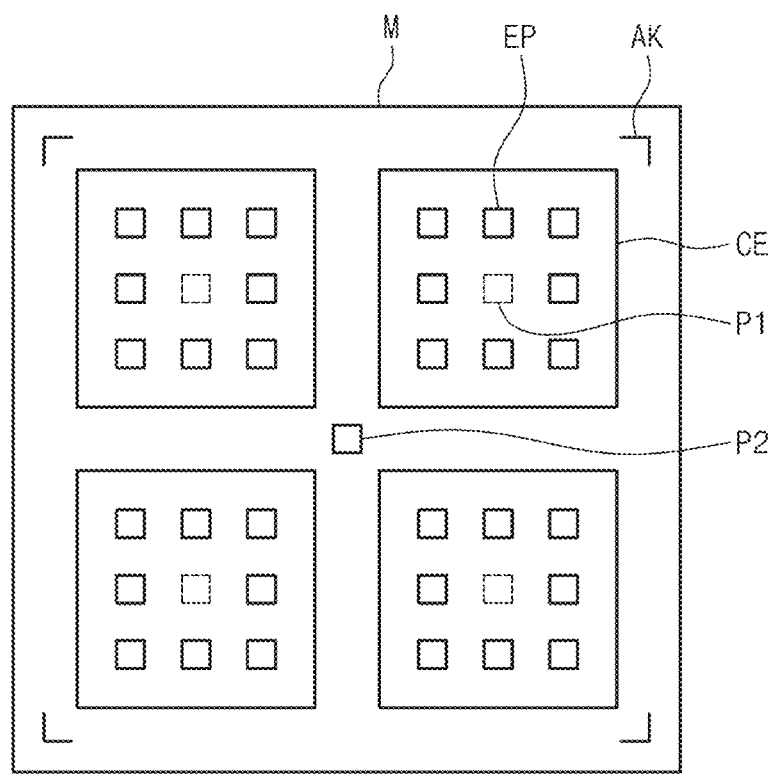
FIG. 4 is a schematic view illustrating a state in which a substrate is treated in a liquid treatment chamber of FIG. 3.

FIG. 4 is a schematic view illustrating a state in which a substrate is treated in a liquid treatment chamber of FIG. 3.

Referring to FIG. 4, a to-be-treated object treated in the liquid treatment chamber 400 may be one substrate among a wafer, a glass, and a photo mask. For example, the substrate "M" treated in the liquid treatment chamber 400 may be a photo mask that is a kind of "frame" used during the exposure process.

The substrate "M" may have a quadrangular shape. The substrate "M" may be a photo mask that is a "frame" used during the exposure process. At least one reference mark AK may be displayed on the substrate "M". For example, the plurality of reference marks AK may be formed at corner regions of the substrate "M". The reference mark AK may be a mark called an align key and used when the substrate "M" is aligned. Further, the reference mark AK may be a mark used to derive positional information on the substrate "M". For example, the liquid treatment chamber 400 may be provided with a vision sensor (not illustrated) such as a camera, the vision sensor may acquire an image by capturing the reference mark AK, and the controller 30 may detect a position or a direction of the substrate "M" by analyzing the image including the reference mark AK. Further, the reference mark AK may also be used to identify the position of the substrate "M" when the substrate "M" is transferred.

A cell CE may be formed on the substrate "M". At least one cell CE, for example, a plurality of cells CE may be formed. A plurality of patterns may be formed in each of the cells CE. The patterns formed in the cells CE may be defined as one pattern group. The patterns formed in the cell CE may include an exposure pattern EP and a first pattern P1. The exposure pattern EP may be used to form an actual pattern on the substrate "M". Further, the first pattern P1 may be a pattern representing the exposure patterns EP formed in one cell CE. Further, when the plurality of cells CE are provided, a plurality of first patterns P1 may be provided. Further, the plurality of first patterns P1 may be formed in the one cell CE. The first pattern P1 may have a shape in which portions of the exposure patterns EP are combined. The first pattern P1 may be called a monitoring pattern. Further, the first pattern P1 may also be called a critical dimension monitoring macro (CDMM).

When the operator inspects the first pattern P1 through a scanning electron microscope (SEM), whether the shapes of the exposure patterns EP formed in the one cell CE are good or bad may be estimated. Further, the first pattern P1 may be an inspection pattern. Further, the first pattern P1 may also be any one pattern among the exposure patterns EP actually participating in the exposure process. Further, the first pattern P1 may be an inspection pattern and a pattern actually participating in the exposure process.

A second pattern P2 may be a pattern representing the exposure patterns EP formed in the entire substrate "M". For example, the second patterns P2 may have a shape in which some of the first patterns P1 are combined.

When the operator inspects the second pattern P2 through the SEM, whether the shapes of the exposure patterns EP formed in the one substrate "M" are good or bad may be estimated. Further, the second pattern P2 may be an inspection pattern. Further, the second pattern P2 may be an inspection pattern that does not actually participate in the exposure process. The second pattern P2 may also be called an anchor pattern.

Hereinafter, the substrate treatment apparatus provided to the liquid treatment chamber 400 will be described in detail. In the substrate "M" carried into the liquid treatment chamber 400, adjustment of the critical dimension of at least one among the first pattern P1, the second pattern P2, and the exposure pattern EP may be required.

Figure 5:
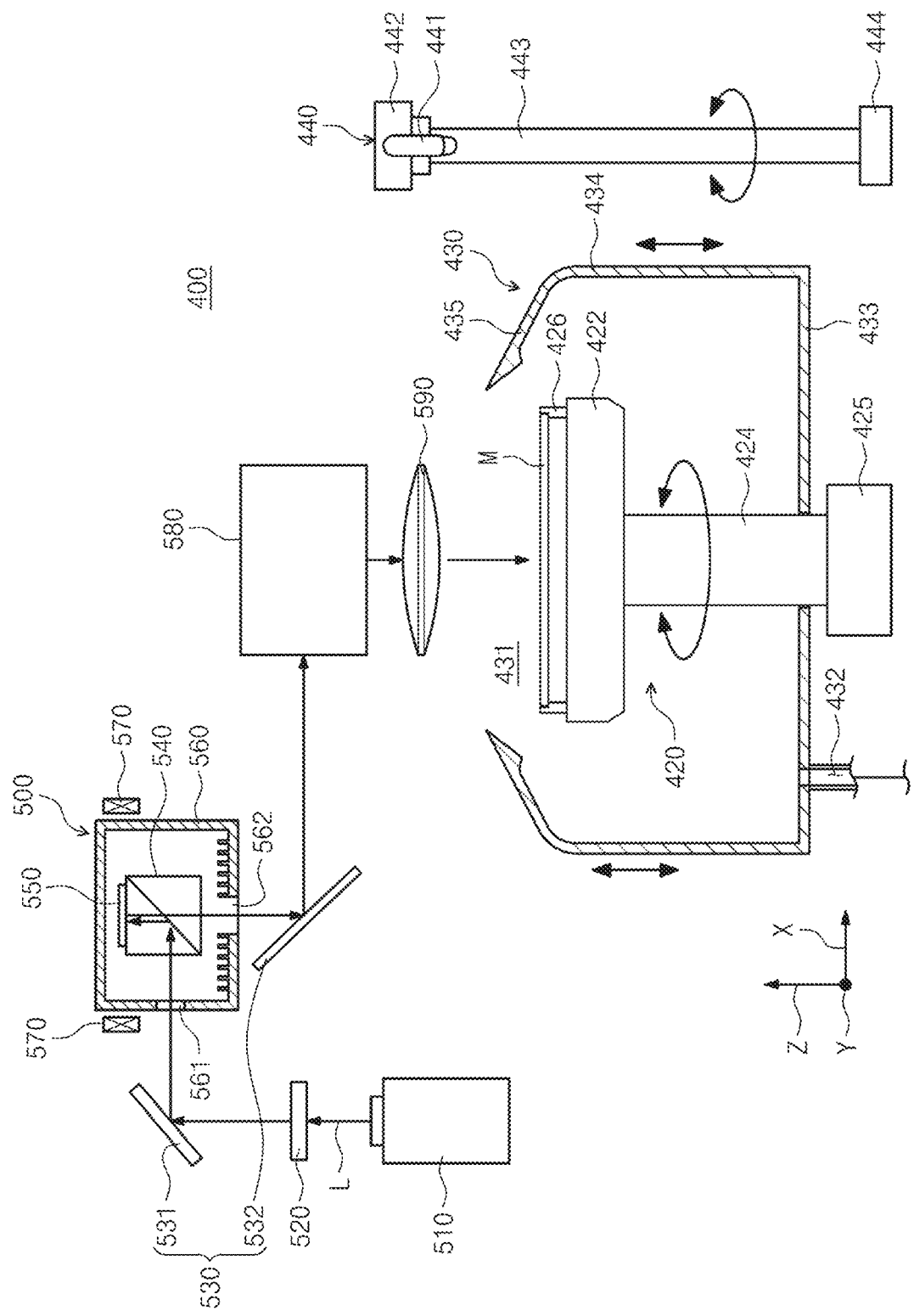
FIG. 5 is a schematic view illustrating the liquid treatment chamber of FIG. 3 according to an embodiment.

FIG. 5 is a schematic view illustrating the liquid treatment chamber of FIG. 3 according to an embodiment. Referring to FIG. 5, the liquid treatment chamber 400 may include a support unit 420, a bowl 430, a chemical liquid supply unit 440, and a light irradiation unit 500.

The support unit 420 may support the substrate "M" in a treatment space 431 defined by the bowl 430. The support unit 420 may support the substrate "M". The support unit 420 may rotate the substrate "M".

The support unit 420 may include a chuck 422, a support shaft 424, a driving member 425, and a support pin 426. The support pin 426 may be installed in the chuck 422. The chuck 422 may have a plate shape having a certain thickness. The support shaft 424 may be coupled to a lower portion of the chuck 422. The support shaft 424 may be a hollow shaft. Further, the support shaft 424 may rotate by the driving member 425. The driving member 425 may be a hollow motor. When the driving member 425 rotates the support shaft 424, the chuck 422 coupled to the support shaft 424 may rotate. The substrate "M" placed on the support pin 426 installed in the chuck 422 may also rotate by the rotation of the chuck 422.

The support pin 426 may support the substrate "M". When viewed from the top, the support pin 426 may have a substantially circular shape. Further, when viewed from the top, the support pin 426 may have a shape in which a portion corresponding to an edge region of the substrate "M" is recessed downward. That is, the support pin 426 may include a first surface supporting a lower portion of an edge region of the substrate "M" and a second surface facing a side portion of the edge region of the substrate "M" to limit movement of the substrate "M" in a lateral direction when the substrate "M" rotates. At least one support pin 426 may be provided. The support pin 426 may be provided as a plurality of support pins 426. The number of support pins 426 may correspond to the number of edge regions of the substrate "M" having a quadrangular shape. The support pin 426 may support the substrate "M" so that a bottom surface of the substrate "M" and an upper surface of the chuck 422 may be spaced apart from each other.

The bowl 430 may have a top-opened cylindrical shape. The bowl 430 may define the treatment space 431. The substrate "M" may be subjected to liquid treatment and heat treatment inside the treatment space 431. The bowl 430 may prevent a treatment liquid supplied to the substrate "M" from being scattered and transferred to the chemical liquid supply unit 440 and the light irradiation unit 500.

The bowl 430 may include a bottom portion 433, a vertical portion 434, and an inclination portion 435. When viewed from the top, an opening into which the support shaft 424 may be inserted may be formed in the bottom portion 433. The vertical portion 434 may extend from the bottom portion 433 in the third direction "Z". The inclination portion 435 may obliquely extend upward from the vertical portion 434. Further, the inclination portion 435 may obliquely extend in a direction toward the substrate "M" supported by the support unit 420. A discharge hole 432 through which the treatment liquid supplied by the chemical liquid supply unit 440 may be discharged to the outside may be formed in the bottom portion 433.

Further, the bowl 430 is coupled to an elevation member (not illustrated), and thus a position of the bowl 430 may be changed. The elevation member may be driving device that moves the bowl 430 in the vertical direction. The elevation member may move the bowl 430 in an upward direction while the substrate "M" is subjected to liquid treatment and/or heat treatment, and move the bowl 430 in a downward direction when the substrate "M" is carried into the liquid treatment chamber 400 or the substrate "M" is carried out from the liquid treatment chamber 400.

The chemical liquid supply unit 440 may support a chemical liquid that liquid-treats the substrate "M". The chemical liquid supply unit 440 may supply the chemical liquid to the substrate "M" supported by the support unit 420. The chemical liquid may be an etching liquid or a rinsing liquid. The etching liquid may be a chemical. The etching liquid may etch a pattern formed on the substrate "M". The etching liquid may be called an etchant. The rinsing liquid may clean the substrate "M". The rinsing liquid may be provided as a known medicinal liquid.

The chemical liquid supply unit 440 may include a nozzle 441, a fixed body 442, a rotary shaft 443, and a rotation member 444.

The nozzle 441 may supply the treatment liquid to the substrate "M" supported by the support unit 420. One end of the nozzle 441 may be coupled to the fixed body 442, and the other end of the nozzle 441 may extend in a direction from the fixed body 442 toward the substrate "M". The nozzle 441 may extend from the fixed body 442 in the first direction "X". Further, the other end of the of the nozzle 441 may extend to be bent by a certain angle in a direction toward the substrate "M" supported by the support unit 420.

As needed, the nozzle 441 may be provided as a plurality of nozzles 441. Any one of the nozzles 441 may be a nozzle through which the above-described etching liquid is discharged, and another one of the nozzles 441 may be a nozzle through which the above-described rinsing liquid is discharged.

The fixed body 442 may fixedly support the nozzle 441. The fixed body 442 may be connected to the rotary shaft 443 that rotates using the third direction "Z" as a reference by the rotation member 444. When the rotation member 444 rotates the rotary shaft 443, the fixed body 442 may rotate using the third direction "Z" as an axis. Accordingly, a discharge port of the nozzle 441 may move between a liquid supply position in which the treatment liquid is supplied to the substrate "M" and a standby position in which the treatment liquid is not supplied to the substrate "M".

The light irradiation unit 500 may irradiate light to the substrate "M" that is a mask. The light irradiation unit 500 may irradiate a laser beam to the substrate "M" that is a mask. The light irradiation unit 500 may be called a laser beam irradiation unit. The light irradiation unit 500 may adjust the critical dimension of the pattern formed on the substrate "M" by irradiating, with light, the substrate "M" in which a liquid film is formed on an upper surface thereof by the chemical liquid (for example, an etching liquid) supplied by the chemical liquid supply unit 440. A temperature of a region of the mask onto which the light irradiated by the light irradiation unit 500 is irradiated may increase. Accordingly, relatively more etching may be performed on a region irradiated with light, and relatively less etching may be formed in a region not irradiated with light. In this manner, the critical dimension of the pattern formed on the substrate "M" may be adjusted.

The light irradiation unit 500 may include a light source 510, a flat top optical mechanism 520, a mirror 530, a prism optical mechanism 540, a light modulation element 550, a light dumper 560, a cooling mechanism 570, an irradiation position change mechanism 580, and a lens 590.

The light source 510 may generate a light beam "L". The light source 510 may generate the light beam "L" having linearity. The light source 510 may generate a laser beam. The light source 510 may be also called a laser beam source. The light beam "L" generated by the light source 510 may be irradiated onto the substrate "M" to heat the substrate "M". The light source 510 may have an output within a range of 20 W per unit area ($cm^2$) or less. When the light source 510 may have the output within the range of 20 W per unit area ($cm^2$), the light modulation element 550 may be properly driven without being damaged.

The flat top optical mechanism 520 may convert the shape of the light output from the light source 510.

Figure 6:
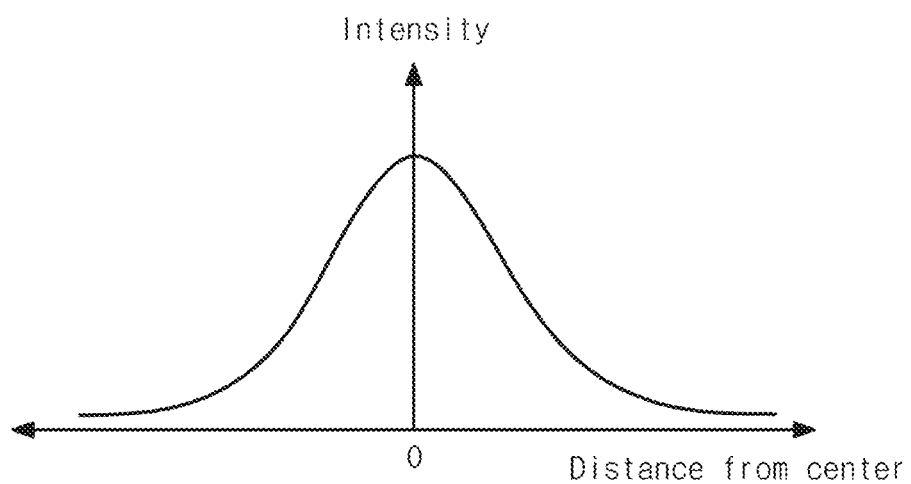
FIG. 6 is a graph depicting a distribution of light output from a light irradiation device.
Figure 7:
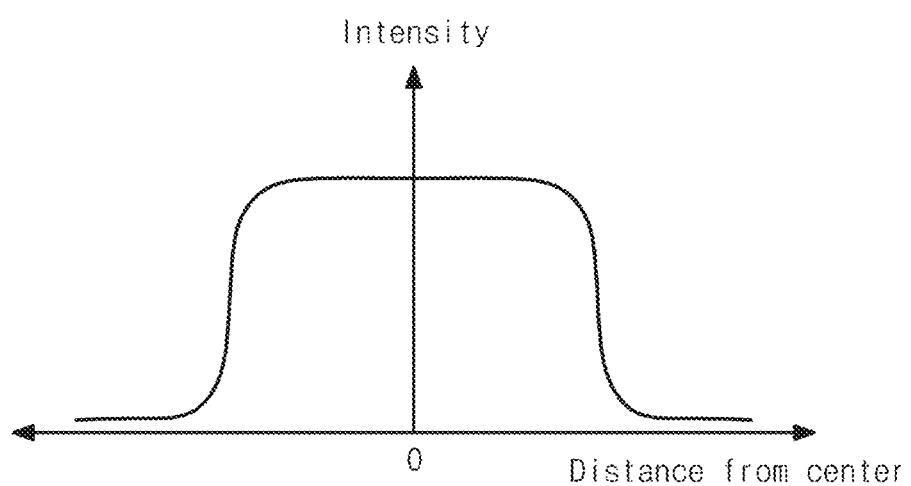
FIG. 7 is a graph depicting a distribution of light passing through a flat top optical mechanism.

FIG. 6 is a graph depicting a distribution of light output from the light source, and FIG. 7 is a graph depicting a distribution of light passing through a flat top optical mechanism.

Referring to FIGS. 5 to 7, the laser beam output from the light source 510 may have a Gaussian shape in which an intensity distribution has a Gaussian distribution as illustrated in FIG. 6. In more detail, the intensity of the laser beam output from the light source 510 may be high at a center of the laser beam and may gradually decrease as a distance from the center of the laser beam increases (see FIG. 6). Thus, when the substrate "M" is irradiated with the laser beam output from the light source 510, a region close to the center of the laser beam may be more heated, and a region close to an edge of the laser beam may be less heated. Accordingly, the light irradiation unit 500 according to the embodiment of the inventive concept may arrange the flat top optical mechanism 520 on a traveling path of the light beam "L" output from the light source 510. The flat top optical mechanism 520 may be a laser beam shaper that converts the light beam "L" output from the light source 510 and having a Gaussian shape into a flat top light beam "L".

The light beam "L" output from the light source 510 may be converted into a flat top shape in which the distribution of intensity (luminous intensity) is relatively uniform as the light beam "L" passes through the flat top optical mechanism 520 (see FIG. 7).

Referring back to FIG. 5, the light beam "L" passing through the flat top optical mechanism 520 may be reflected by a first mirror 531 among the mirrors 530. The light reflected by the first mirror 531 may be transferred to the prism optical mechanism 540.

The prism optical mechanism 540 may reflect the light beam "L" passing through the flat top optical mechanism 520 and reflected by the first mirror 531 to the light modulation element 550 again. The light beam "L" transferred to the light modulation element 550 may be modulated and output by the light modulation element 550. The light beam "L" modulated and output by the light modulation element 550 may be transferred to a second mirror 532 among the mirrors 530 while passing through the prism optical mechanism 540. The light beam "L" transferred to the second mirror 532 may be reflected and transferred to the irradiation position change mechanism 580.

The light modulation element 550 may modulate the transferred light beam "L". The light modulation element 550 may modulate the light beam "L" generated by the light source 510 to form an irradiation pattern. The light modulation element 550 may be a digital micro-mirror device (DMD) element.

Figure 8:
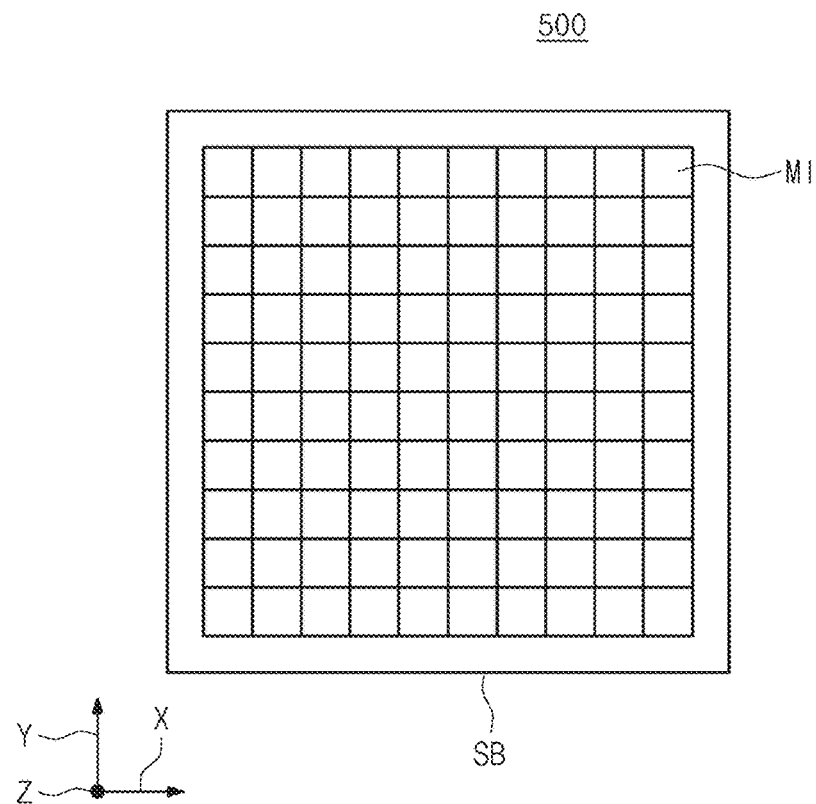
FIG. 8 is a schematic view illustrating a state of a light modulation element.

FIG. 8 is a schematic view illustrating a state of a light modulation element. The light modulation element 550 may include an element substrate SB and a plurality of micromirrors MI. Electrodes respectively corresponding to the plurality of micromirrors MI may be installed in the element substrate SB. The controller 30 may transmit a digital signal of "0" or "1" to the electrodes installed in the element substrate SB. The micromirrors MI may be rotatably configured. The micromirrors MI may be rotatably configured using the first direction "X", the second direction "Y", and a direction parallel to a plane passing through the first direction "X" and the second direction "Y" as an axis. The micromirror MI corresponding to the electrode to which the digital signal of "0" is transmitted may be in an off state, and the micromirror MI corresponding to the electrode to which the digital signal of "1" is transmitted may be in an on state. The micromirror MI in the on state may irradiate the substrate "M" with the light beam "L", and the substrate "M" may not be irradiated with the light beam "L" reflected by the micromirror MI in the off state.

Figure 9:
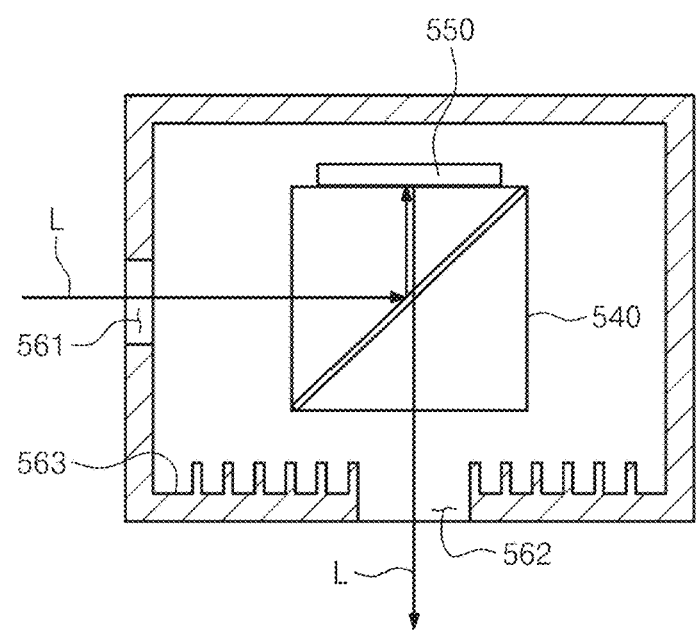
FIG. 9 is a view in which the substrate is irradiated with light output from the light modulation element.

FIG. 9 is a view illustrating a state in which the substrate is irradiated with light output from the light modulation element. For convenience of description, FIG. 9 illustrates a traveling path of the light reflected by any one micromirror MI among the micromirrors MI. Referring to FIGS. 5, 8, and 9, the light beam "L" reflected by the micromirror MI in the on state may be transferred to the substrate "M".

Figure 10:
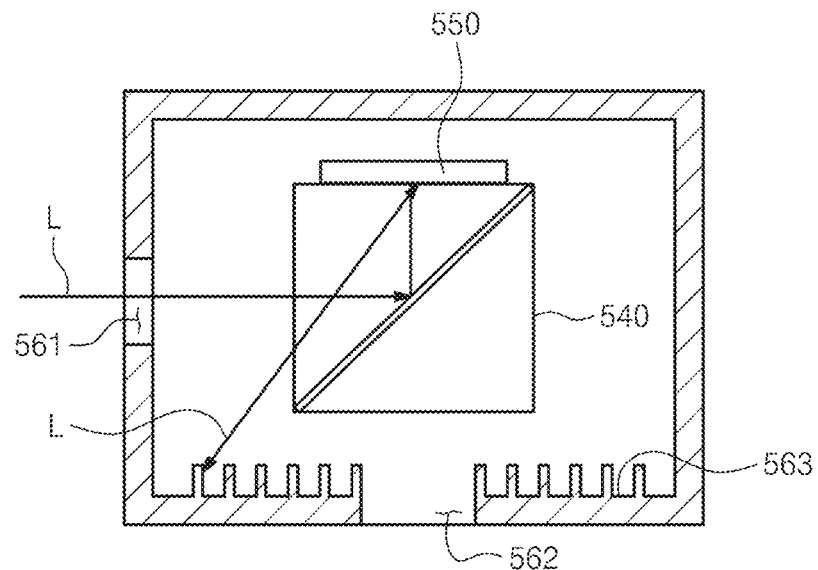
FIG. 10 is a view illustrating a state in which the light output from the light modulation element is removed by an optical dumper.

FIG. 10 is a view illustrating a state in which the light output from the light modulation element is removed by an optical dumper. For convenience of description, FIG. 10 illustrates a traveling path of the light beam "L" reflected by any one micromirror MI among the micromirrors MI. Referring to FIGS. 5, 8, and 10, the micromirror MI in the off state may reflect the light beam "L", and thus the light beam "L" may not be transferred to the substrate "M". In detail, the micromirror MI may be rotatably configured as described above. The micromirror MI in the off state may rotate to change the traveling path of the light "L" transferred from the light source 510 so that the light is not transferred to the substrate "M". The light beam "L" emitted from the micromirror MI in the off state may be irradiated to an inner surface of the light dumper 560 without passing through a second hole 562 of the light dumper 560, which will be described below, and may thus be extinguished.

Figure 11:
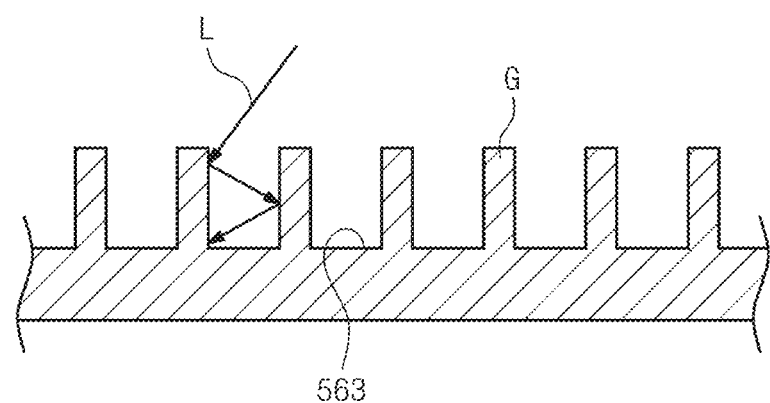
FIG. 11 is a view for describing a principle of removing the light from the optical dumper.

FIG. 11 is a view for describing a principle of removing the light from the optical dumper. Referring to FIGS. 5 and 11, the light dumper 560 may have a hollow tubular shape. The light dumper 560 may be made of a material such as synthetic resin capable of absorbing and removing the light beam "L". The prism optical mechanism 540 may be disposed in an inner space of the light dumper 560. The light modulation element 550 may be disposed in the inner space of the light dumper 560 or may be installed outside the light dumper 560.

The light dumper 560 may include a first hole 561 and the second hole 562. The first hole 561 may be formed on a lateral side of the light dumper 560. The first hole 561 may be a hole through which the light beam "L" generated by the light source 510 and converted through the flat top optical mechanism 520 passes. The second hole 562 may be a hole through which the light beam "L" modulated by the light modulation element 550 passes. The second hole 562 may be formed on a lower side of the light dumper 560.

A groove G may be formed in an inner surface 563 of the light dumper 560. The groove G formed in the inner surface 563 of the light dumper 560 may absorb the light reflected by the micromirror MI in the off state. In detail, when the light beam "L" is transferred to the groove G, the light beam "L" may be removed while being reflected several times in the groove G. The light beam "L" may be removed while being reflected several times in the groove G and losing heat energy to the light dumper 560. FIGS. 5 and 11 illustrate an example in which the groove G is formed only at a lower portion of the light dumper 560, but the inventive concept is not limited thereto, and the groove G may be formed over the entire inner surface 563 of the light dumper 560.

Referring back to FIG. 5, as the light dumper 560 removes the light beam "L", the temperature of the light dumper 560 may increase. Accordingly, the light irradiation unit 500 according to the embodiment of the inventive concept may include the cooling mechanism 570 that cools the light dumper 560. The cooling mechanism 570 may be a fan that forms an airflow for cooling the light dumper 560.

Figure 12:
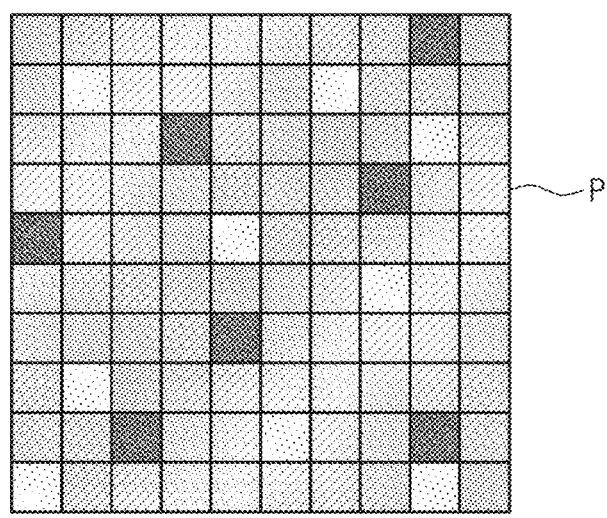
FIG. 12 is a view for describing an irradiation pattern of the light output from the light modulation element.

FIG. 12 is a view for describing an irradiation pattern of the light output from the light modulation element. Referring to FIGS. 5, 8, and 12, as described above, the micromirrors MI may be switched between the on state and the off state. State switching of the micromirrors MI between the on state and the off state may be performed within a very short time. As the micromirrors MI are switched between the on state and the off state, the light modulation element 550 may form various irradiation patterns HP. For example, FIG. 12 illustrates the amount of heat by which the light beam "L" reflected by the micromirror MI in a unit time (for example, one second) is transferred to the substrate "M" per unit time. The irradiation pattern HP may include a plurality of patterns P corresponding to the micromirrors MI, respectively. When it is desired to increase the amount of heat transferred from the micromirror MI to the substrate "M" per unit time, the on state of the micromirror MI may be maintained long and the off state thereof may be maintained short per unit time. When it is desired to decrease the amount of heat transferred from the micromirror MI to the substrate "M" per unit time, the on state of the micromirror MI may be maintained short and the off state thereof may be maintained long per unit time.

Figure 13:
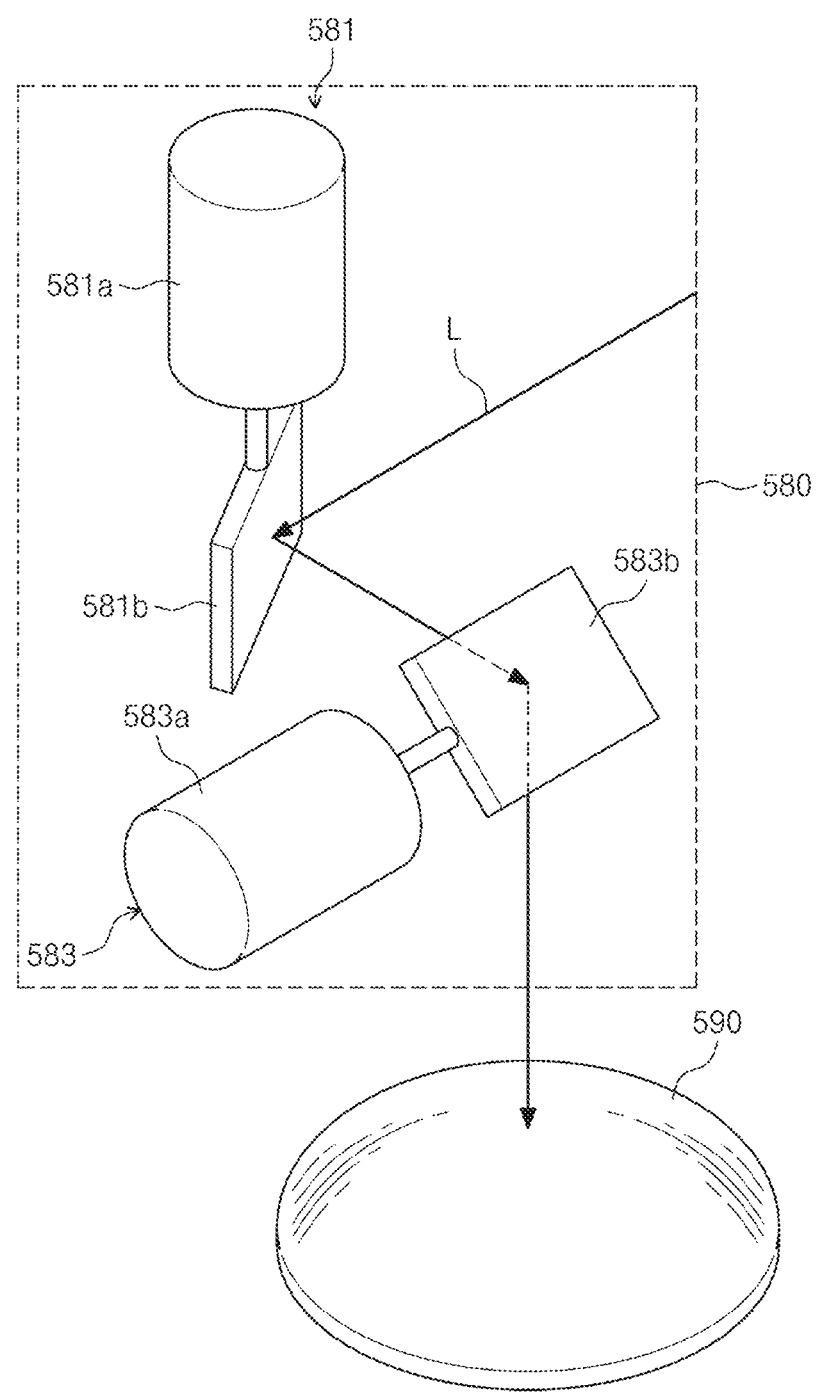
FIG. 13 is a view illustrating a state in which an irradiation position change mechanism changes an irradiation position of the light.

FIG. 13 is a view illustrating a state in which an irradiation position change mechanism changes an irradiation position of the light. Referring to FIGS. 5 and 13, the irradiation position change mechanism 580 may change the irradiation position by reflecting the light beam "L" modulated by the light modulation element 550 and thus having a specific irradiation pattern HP. The irradiation position change mechanism 580 may be installed in the liquid treatment chamber 400 while a position thereof is fixed. The irradiation position change mechanism 580 may include a first reflective mechanism 581 and a second reflective mechanism 583. The first reflective mechanism 581 may include a first rotational driver 581a and a first rotational mirror 581b. The second reflective mechanism 583 may include a second rotational driver 583a and a second rotational mirror 583b. The first rotational driver 581a and the second rotational driver 583a may be motors. The light modulated by the light modulation element 550 may be reflected by the first reflective mechanism 581 and transferred to the second reflective mechanism 583. The light beam "L" transferred to the second reflective mechanism 583 may be reflected again by the second reflective mechanism 583 and transferred to the lens 590. The irradiation position change mechanism 580 may be a Galvano scanner.

A rotary shaft of the first rotational mirror 581b and a rotary shaft of the second rotational mirror 583b may not be parallel to each other. Further, as needed, the rotary shaft of the first rotational mirror 581b and the rotary shaft of the second rotational mirror 583b may not be perpendicular to each other. Accordingly, the irradiation position of the light beam "L" reflected and transferred through the second mirror 532 may be variously changed by rotation of the first rotational mirror 581b and the second rotational mirror 583b.

Figure 14:
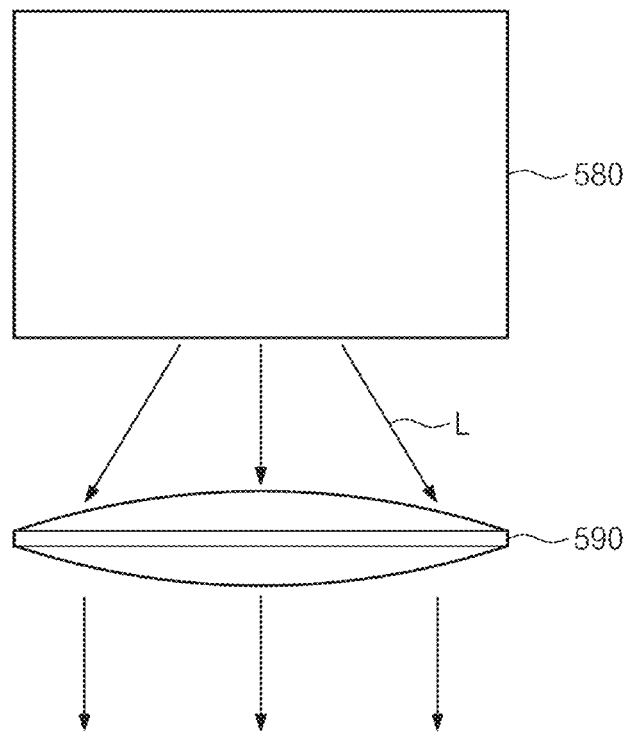
FIG. 14 is a view illustrating a state in which the irradiation position change mechanism changes a traveling direction of light traveling in an oblique direction into a vertical direction.

FIG. 14 is a view illustrating a state in which the irradiation position change mechanism changes a traveling direction of light traveling in an oblique direction into a vertical direction. Referring to FIGS. 5 and 14, the light beam "L" of which the irradiation position is changed by the irradiation position change mechanism 580 may travel in an inclined direction. When the light beam "L" traveling in an oblique direction by the irradiation position change mechanism 580 is directly transferred to the substrate "M", the light beam "L" may be obliquely input to the substrate "M". To solve this problem, in the light irradiation unit 500 according to the embodiment of the inventive concept, the lens 590 may be disposed between the irradiation position change mechanism 580 and the support unit 420. The lens 590 may be an F-Theta lens. The lens 590 may be configured to refract the light traveling obliquely with respect to the third direction "Z" perpendicular to the ground by the irradiation position change mechanism 580 in the third direction "Z" that is a vertical direction.

Figure 15:
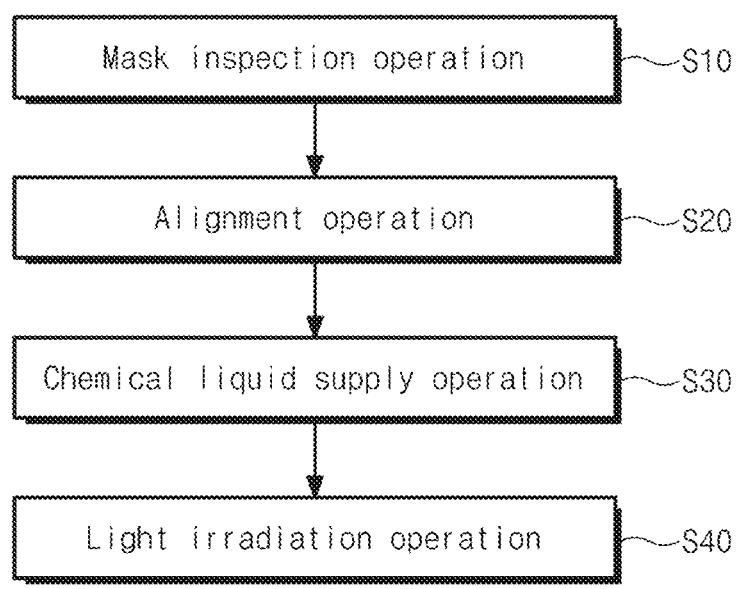
FIG. 15 is a flowchart illustrating a substrate treatment method according to an embodiment of the inventive concept.

FIG. 15 is a flowchart illustrating a substrate treatment method according to an embodiment of the inventive concept. The substrate treatment method according to the embodiment of the inventive concept may be a mask treatment method that treats a mask. The substrate treatment method, which will be described below, may be performed as the controller 30 controls components provided in the substrate treatment apparatus.

Referring to FIGS. 4, 5, and 15, the substrate treatment method according to the embodiment of the inventive concept may include a mask inspection operation S10, an alignment operation S20, a chemical liquid supply operation S30, and a light irradiation operation S40.

In the mask inspection operation S10, critical dimensions of the patterns formed on the substrate "M" may be inspected. For example, in the mask inspection operation S10, the critical dimensions of the first pattern P1, the second pattern P2, and the exposure pattern EP formed on the substrate "M" may be inspected.

In the mask inspection operation S10, among the first pattern P1, the second pattern P2, and the exposure pattern EP formed on the substrate "M", patterns requiring adjustment of the critical dimensions of the patterns may be specified. In the mask inspection operation S10, regions on the substrate "M" requiring irradiation with the light beam "L" may be specified. The mask inspection operation S10 may be performed in a manner of capturing an image of the substrate "M" using a vision sensor such as a camera. The mask inspection operation S10 may be performed in an inspection chamber (not illustrated) provided in the substrate treatment apparatus of the inventive concept or may be performed in a separate inspection chamber provided outside the substrate treatment apparatus. In the mask inspection operation S10, regions requiring adjustment of the critical dimension of the pattern on the substrate "M" (that is, regions requiring heating by the light beam "L") may be mapped through vision inspection. In the mask inspection operation S10, mapping data for the mapped regions requiring the adjustment of the critical dimension may include positions and sizes of the regions requiring the adjustment of the critical dimension on the substrate "M", the critical dimensions of the patterns, and the like. The controller 30 may store the mapping data.

Referring to FIG. 15, in the alignment operation S20, alignment of the position and direction of the substrate "M" and alignment of the irradiation position of the light beam "L" emitted from the light irradiation unit 500 may be performed.

First, the alignment of the position and direction of the substrate "M" may be performed using an alignment mark AK displayed on the substrate "M". For example, the image of the substrate "M" is captured using a vision sensor such as a camera of the liquid treatment chamber 400, and a position in which the substrate "M" is placed on the support unit 420 and the direction of the substrate "M" may be identified and aligned through the alignment mark AK displayed on the substrate "M". For example, when the position of the substrate "M" is distorted, the position of the substrate "M" may be aligned by the transfer robot 320. Further, when the position of the substrate "M" is distorted, the light irradiation unit 500 may emit the light beam "L" in reflection of the distorted position. Further, when the position of the substrate "M" is distorted, the support unit 420 may rotate the substrate "M" to align the direction of the substrate "M".

Figure 16:
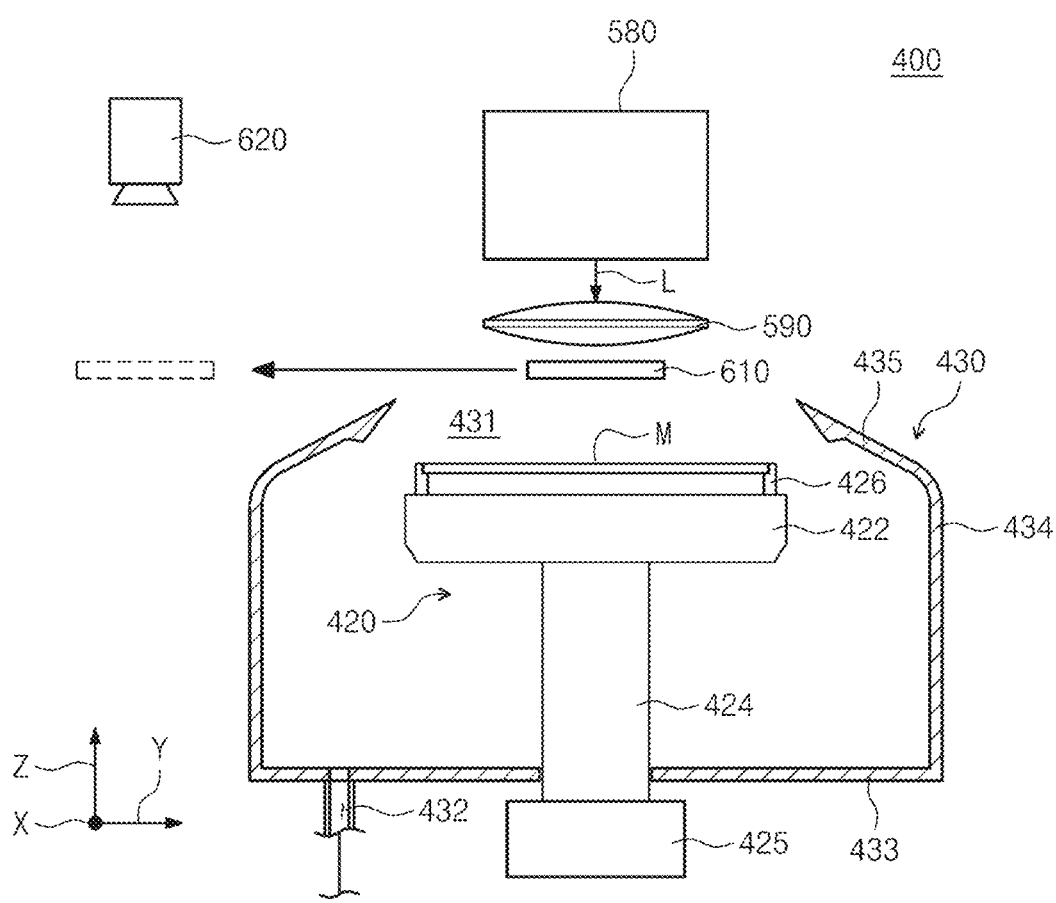
FIG. 16 is a view illustrating a state in which the substrate treatment apparatus performs an alignment operation of FIG. 15.

FIG. 16 is a view illustrating a state in which the substrate treatment apparatus performs an alignment operation of FIG. 15. Referring to FIG. 16, the alignment of the irradiation position of the light beam "L" emitted by the light irradiation unit 500 may be applied by utilizing alignment units 610 and 620. For example, the liquid treatment chamber 400 may be provided with the alignment units 610 and 620. The alignment units 610 and 620 may include the alignment plate 610 that may move between the substrate "M" and the lens 590 in a horizontal direction and the alignment camera 620.

In the alignment operation S20, in a position in which the light beam "L" emitted by the light irradiation unit 500 is irradiated, the alignment plate 610 may be positioned below the irradiation position change mechanism 580 (Galvano scanner) that changes the irradiation position of the light beam "L", and the light irradiation unit 500 may irradiate the alignment plate 610 with the light beam "L". The light beam "L" with which the alignment plate 610 is irradiated may leave a trace of the light beam "L" with which the alignment plate 610 is irradiated. The alignment plate 610 may move to a lower side of the alignment camera 620 that is a vision sensor by a movement mechanism that is not illustrated. The alignment camera 620 may capture an image of the trace of the irradiated light beam "L". The image of the alignment plate 610 captured by the alignment camera 620 may be transmitted to the controller 30, and the controller 30 may identify whether the irradiation position of the light irradiation unit 500 is distorted on the basis of the received image.

For example, in a state in which the irradiation position change mechanism 580 of the light irradiation unit 500 is set to irradiate a set position with the light beam "L", the alignment plate 610 is irradiated with the light, an actual irradiation position at which the irradiation position change mechanism 580 actually emits the light beam "L" is estimated by comprehensively considering direction and distance in which the alignment plate 610 moves and coordinate values of a position at which the alignment plate 610 is irradiated with the light beam "L", whether the position at which the light irradiation unit 500 is irradiated with the light beam "L" is aligned is identified by comparing the actual irradiation position and the set position, and when the alignment is not achieved, the irradiation position change mechanism 580 may operate in reflection of an error value.

Figure 17:
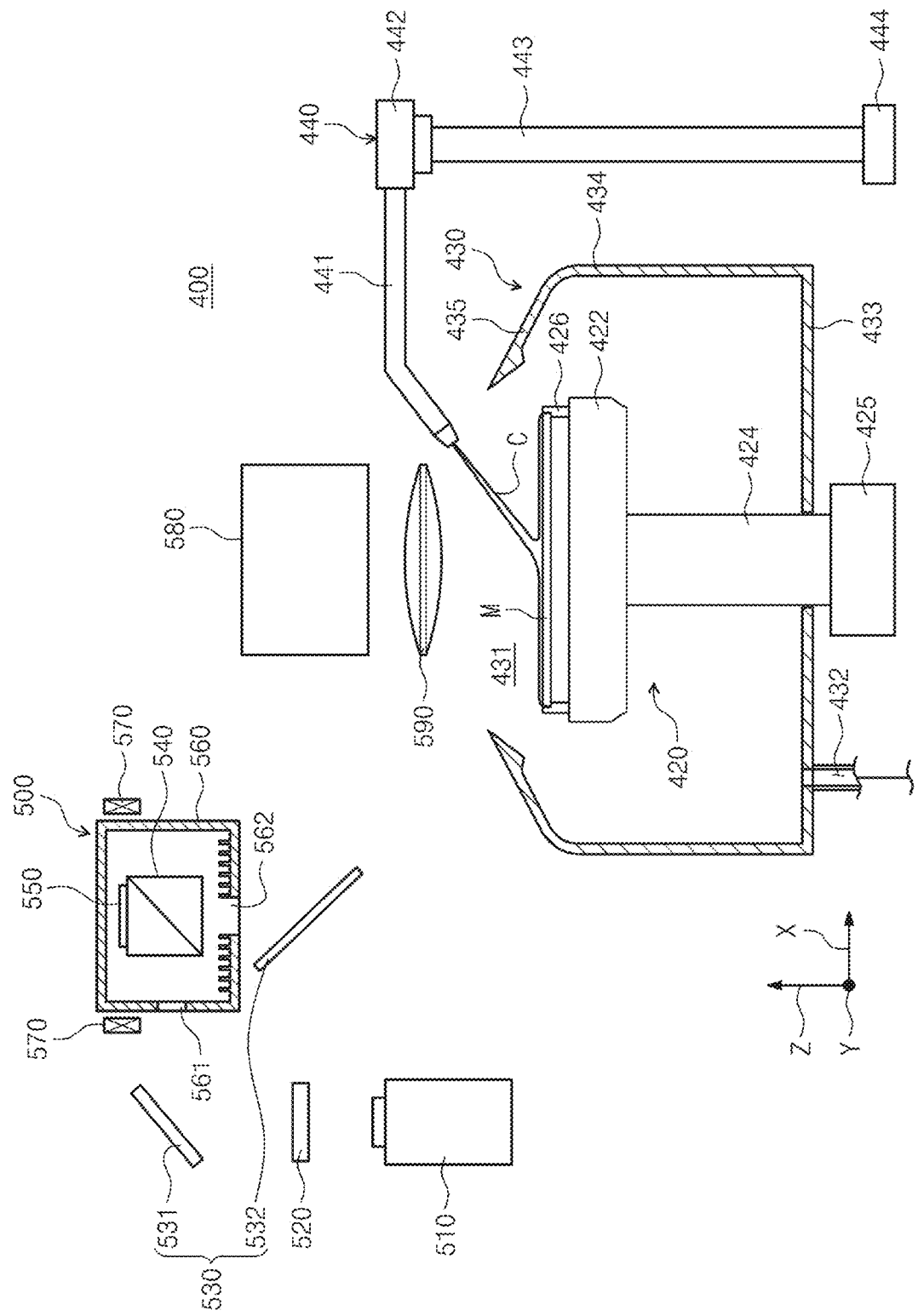
FIG. 17 is a view illustrating a state in which the substrate treatment apparatus performs a chemical liquid supply operation of FIG. 15.

FIG. 17 is a view illustrating a state in which the substrate treatment apparatus performs a chemical liquid supply operation of FIG. 15. Referring to FIGS. 4, 15, and 17, in the chemical liquid supply operation S30, a chemical liquid "C" may be supplied to the substrate "M". In the chemical liquid supply operation S30, the chemical liquid "C" may be supplied with rotating the substrate "M" and unlike this, the chemical liquid "C" may be supplied without rotating the substrate "M". In the chemical liquid supply operation S30, the supplied chemical liquid "C" may be an etching liquid. The chemical liquid "C" may be called an etchant. When the chemical liquid supply operation S30 is terminated, a liquid film may be formed on the substrate "M" by the chemical liquid "C". In the chemical liquid supply operation S30, the support unit 420 may rotate the substrate "M" or may support the substrate "M" without rotating the substrate "M" to prevent the substrate "M" from being misaligned.

Figure 18:
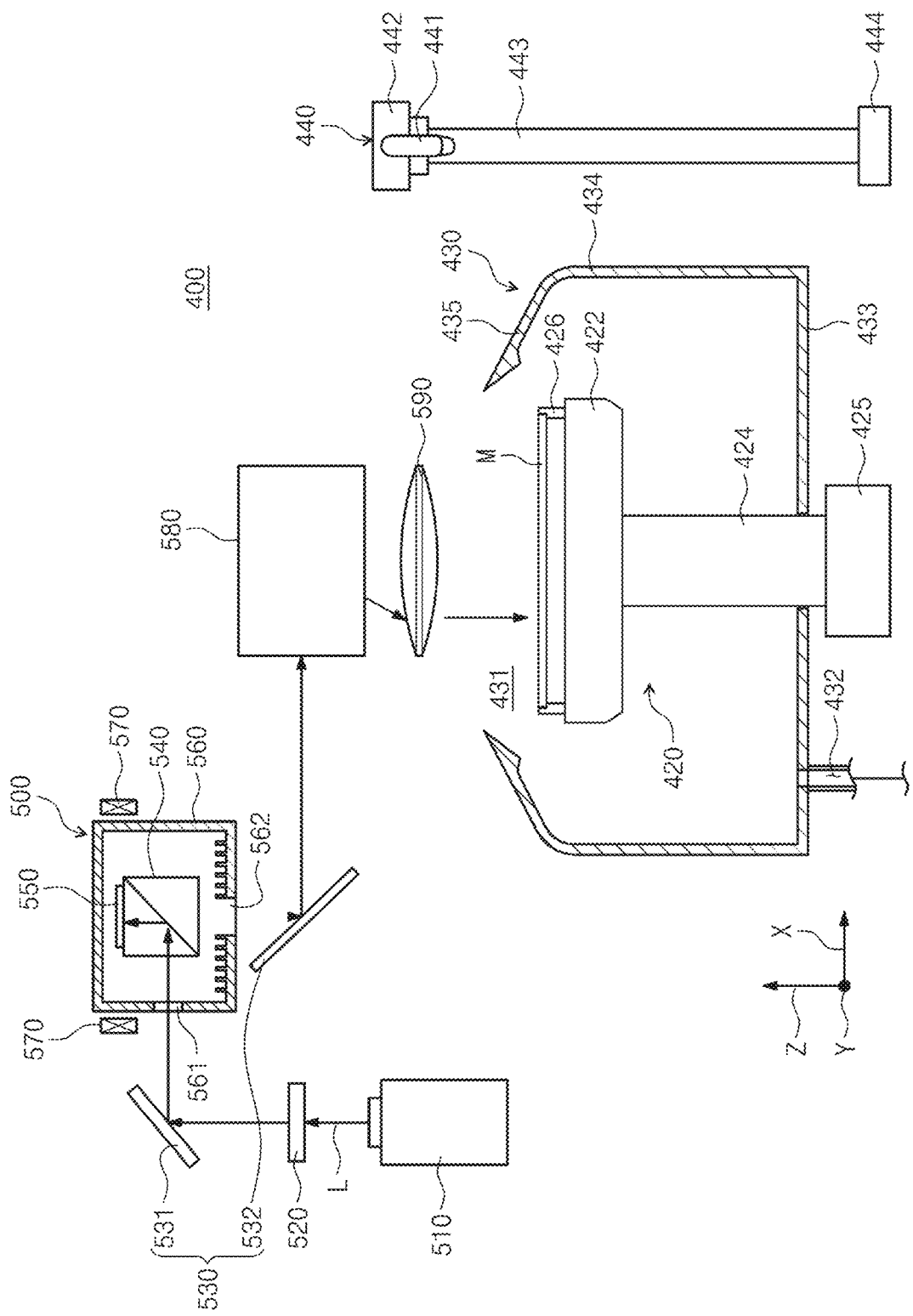
FIGS. 18 and 19 are views illustrating a state in which the substrate treatment apparatus performs a light irradiation operation of FIG. 15.
Figure 19:
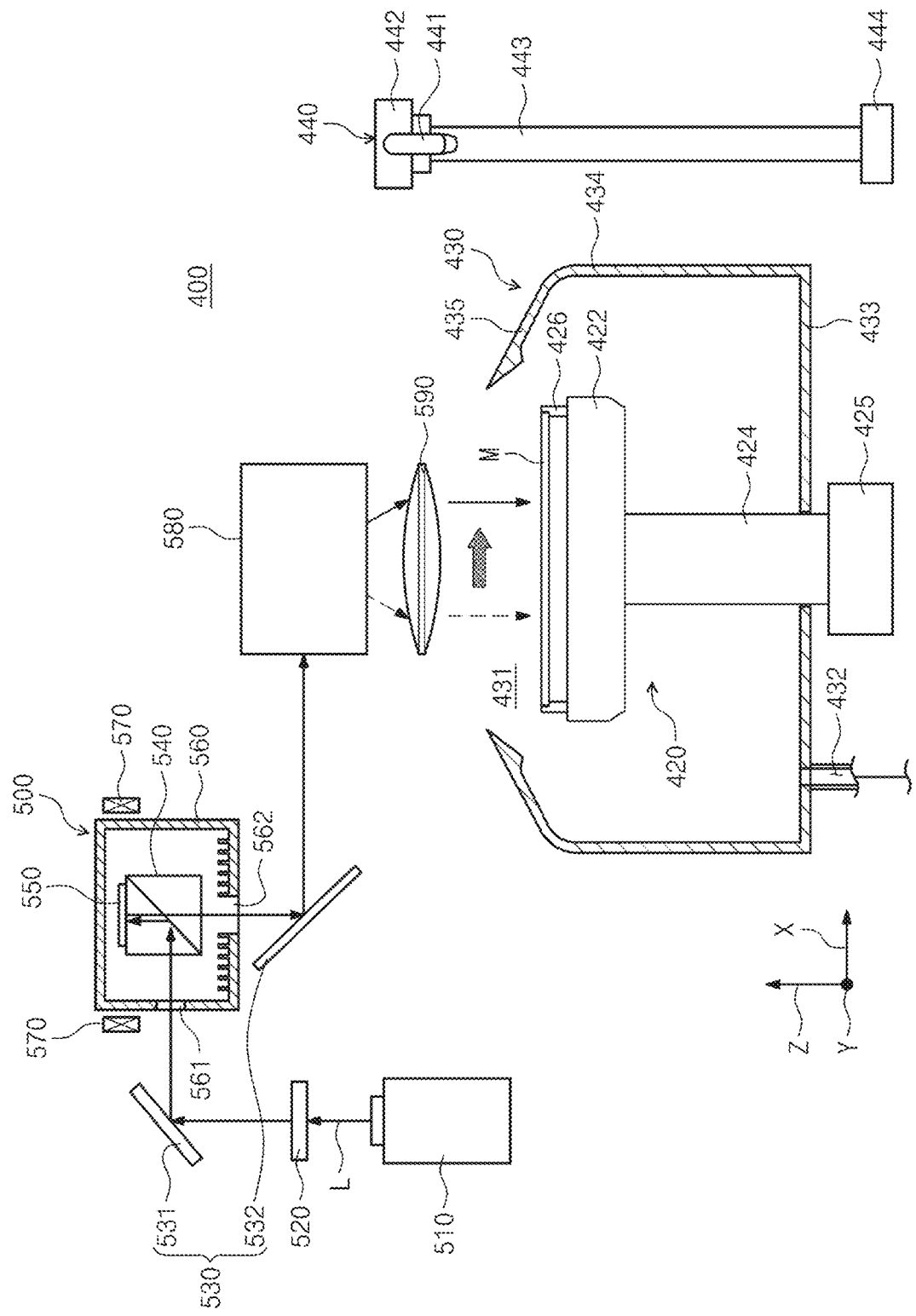
Figure 20:
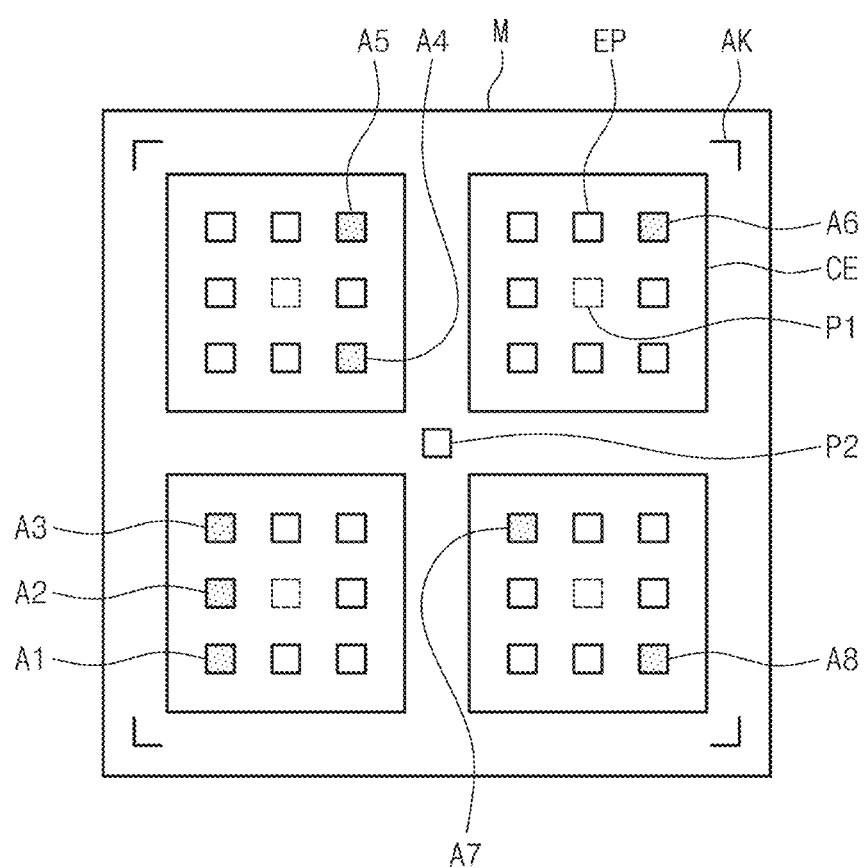
FIG. 20 is a view of a mask for describing an irradiation sequence of a light irradiation unit.

FIGS. 18 and 19 are views illustrating a state in which the substrate treatment apparatus performs a light irradiation operation of FIG. 15, and FIG. 20 is a view of a mask for describing an irradiation sequence of a light irradiation unit. Referring to FIGS. 15 and 18 to 20, in the light irradiation operation S40, light is irradiated to an upper surface of the substrate "M" on which the liquid film is formed by the chemical liquid "C", and thus may heat a specific region of the substrate "M". The entire etching of the pattern on the substrate "M" may be performed by the chemical liquid "C", and the specific region irradiated with the light "L" is heated so that etching may be further performed. A degree of etching may vary depending on the amount of heat per unit time transferred by the light beam "L", and the light modulation element 550 according to the inventive concept may form irradiation patterns having various shapes, and thus the etching on the substrate "M" may be controlled in various shapes. In the light irradiation operation S40, the support unit 420 may support the substrate "M" without rotating the substrate "M".

Further, as illustrated in FIG. 20, in the mask inspection operation S10, the light irradiation unit 500 may irradiate regions requiring irradiation of the specific light beam "L", in other words, regions A1 to A8 requiring heating, with the light beam "L" having a specific irradiation pattern. For example, when the first region A1 is irradiated with the light beam "L", the light modulation element 550 may form a first irradiation pattern, and when the second region A2 different from the first region A1 is irradiated with the light beam "L", the light modulation element 550 may form a second irradiation pattern. Further, an irradiation sequence of the light beam "L" for the regions A1 to A8 requiring the irradiation of the light beam "L" is not sequentially determined according to the position thereof, but may be determined randomly. The controller 30 may store an algorithm for randomly determining the irradiation sequence for the regions requiring the irradiation of the light beam "L" specified in the mask inspection operation S10. In the irradiation sequence of the light beam "L" for the regions A1 to A8 requiring the irradiation of the light beam "L", when the irradiation sequence is sequentially determined according to the position thereof, a time during which heat is transferred to the specific region may excessively increase. For example, when the regions A1, A2, and A3 are sequentially heated, the region A2 indirectly receives heat generated while the region A1 is heated and indirectly receive heat generated while the region A3 is heated. Further, a time during which the regions A4 to A8 far from the regions A1, A2, and A3 are exposed to the chemical liquid "C" without heat transfer increases. In other words, when the irradiation sequence of the light beam "L" for the regions A1 to A8 requiring the irradiation of the light beam "L" is sequentially determined depending on the position thereof, it is difficult to precisely adjust the critical dimension of the pattern.

Thus, the controller 30 of the inventive concept may randomly determine the irradiation sequence of the light beam "L", thereby minimizing occurrence of the above problems. Further, the reason why the inventive concept may randomize the irradiation sequence of the light beam "L" is because the irradiation position of the light beam "L" in the inventive concept is changed not by moving the substrate "M" but by changing the traveling direction of the light beam "L" itself by the irradiation position change mechanism 580. For example, in the light beam "L" in a fixed state, when the irradiation position of the light beam "L" is changed by moving a stage supporting the substrate "M", a time during which the stage moves increases when the irradiation sequence is randomized, and thus a time consumed for treating the substrate "M" may increase.

However, in the inventive concept, while the substrate "M" is irradiated with the light beam "L" and/or while the irradiation position of the light beam "L" is changed, the support unit 420 maintains a horizontal position of the substrate "M" in a fixed state, and the irradiation position change mechanism 580 changes the traveling direction of the light beam "L" itself. Thus, even when the irradiation sequence is randomized, the time consumed for treating the substrate "M" hardly increases.

Further, the light modulation element 550 according to the inventive concept may modulate the light beam "L" by maintaining the width of the light beam "L" generated by the light source 510 or reducing the width of the light beam "L". When the light beam "L" is transferred to the substrate "M", the number of micromirrors MI applied to heat a unit area increases. Thus, even when some of the micromirrors MI that heat the unit area fail, the other micromirrors MI may sufficiently perform heating.

It has been described in the above example that the substrate "M" is a mask, but the inventive concept is not limited thereto. For example, the substrate may be provided as various types of substrates, such as a wafer or a glass substrate, requiring the etching or the adjustment of the critical dimension of the pattern.

According to an embodiment of the inventive concept, a mask may be effectively treated, Further, according to the embodiment of the inventive concept, a critical dimension of a pattern formed in the mask may be effectively adjusted.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A mask treatment apparatus for treating a mask, comprising:
    a support unit configured to support the mask; and
    a light irradiation unit configured to irradiate the mask with light to adjust a critical dimension of a pattern in the mask,
    wherein the light irradiation unit includes
    a light source configured to generate light; and
    a light modulation element configured to modulate the light generated by the light source and form an irradiation pattern, the light modulation element including a plurality of micromirrors that are configured to rotate,
    an element substrate in which the micromirrors are installed; and
    a light dumper configured to remove light of which a reflection direction is changed by the micromirrors and which is thus not transmitted to the mask,
    the light dumper having a hollow cylindrical shape and a hole through which the light modulated by the light modulation element passes, and
    wherein at least a portion of an inner surface of the light dumper includes a groove configured to remove the light of which the reflection direction is changed by the micromirrors and which is thus not transferred to the mask.

2. The mask treatment apparatus of claim 1, wherein the light dumper has a first hole through which light generated by the light source passes and enters the light dumper, and a second hole through which light modulated by the light modulation element passes and exits the light dumper.

3. The mask treatment apparatus of claim 1, wherein the light irradiation unit further includes a cooling mechanism configured to cool the light dumper.

4. The mask treatment apparatus of claim 1, further comprising:
    an irradiation position change mechanism configured to change an irradiation position of the light modulated by the light modulation element,
    wherein the irradiation position change mechanism includes:
    a rotational driver; and
    a rotational mirror that is coupled to the rotational driver and is configured to rotate.

5. The mask treatment apparatus of claim 4, wherein the rotational driver includes a plurality of rotational drivers and the rotational mirror includes a plurality of rotational mirrors, and
    a rotary shaft of any one of the rotational mirrors and a rotary shaft of another one of the rotational mirrors are not parallel to each other.

6. The mask treatment apparatus of claim 4, further comprising:
    an F-Theta lens installed between the irradiation position change mechanism and the support unit and configured to refract the light traveling obliquely by the irradiation position change mechanism in a vertical direction.

7. The mask treatment apparatus of claim 1, further comprising:
    a controller configured to control the light irradiation unit,
    wherein the controller controls the light modulation element to form an irradiation pattern in each of a plurality of regions of the mask and randomly determines an irradiation sequence of the plurality of regions.

8. A mask treatment apparatus for treating an extreme ultraviolet (EUV) mask by reflecting an EUV light and forming a pattern on a substrate, the apparatus comprising:
    a support unit configured to support a mask;
    a liquid supply unit configured to supply a chemical liquid that is an etchant to the mask; and
    a laser beam irradiation unit configured to irradiate, with a laser beam, the mask in which a liquid film is formed by the chemical liquid supplied by the liquid supply unit, and adjust a critical dimension of a pattern formed in the mask,
    wherein the laser beam irradiation unit includes:
    a laser beam source configured to generate a laser beam having a Gaussian shape;
    a digital micro-mirror device (DMD) element configured to modulate the laser beam generated by the laser beam source to form an irradiation pattern;
    a laser beam dumper configured to remove a laser beam of which a reflection direction is changed by the DMD element and which is thus not irradiated to the substrate, a hole through which the laser beam modulated by the DMD element passes being formed in the laser beam dumper, and a plurality of grooves configured to remove the laser beam not irradiated to the substrate being formed in an inner surface of the laser beam dumper;
    a flat top optical mechanism installed between the laser beam source and the DMD element and configured to convert the laser beam having a Gaussian shape into a laser beam having a flat top shape;
    an irradiation position change mechanism that is a Galvano scanner configured to change a position at which the mask is irradiated with the laser beam modulated by the DMD element; and an F-Theta lens positioned between the irradiation position change mechanism and the support unit and configured to change a traveling direction of the laser beam passing through the irradiation position change mechanism in a vertical direction.

9. The mask treatment apparatus of claim 8, further comprising:
a controller configured to control the laser beam irradiation unit and the chemical liquid supply unit,
wherein the controller is configured to perform
controlling the chemical liquid supply unit so that the chemical liquid supply unit supplies a chemical liquid to the mask supported by the support unit to form the liquid film;
randomly determining, by the controller, an irradiation sequence of the laser beam for a plurality of regions of the mask requiring irradiation of the laser beam;
controlling the DMD element so that the DMD element forms an irradiation pattern corresponding to a region, which is to be irradiated with the laser beam, among the plurality of regions; and
irradiating the mask with the laser beam according to the formed irradiation pattern and the irradiation sequence.

10. The mask treatment apparatus of claim 1, wherein the light modulation element includes a digital micro-mirror device (DMD).

11. The mask treatment apparatus of claim 1, wherein the light irradiation unit includes a flat top optical mechanism between the light source and the light modulation element and configured to change the shape of light generated by the light source.

12. The mask treatment apparatus of claim 1, wherein the light modulation element is in an inner space of the light dumper.

13. The mask treatment apparatus of claim 1, further comprising:
a prism optical mechanism in an inner space of the light dumper, the prism optical mechanism configured to reflect light generated by the light source towards the light modulation element.

14. The mask treatment apparatus of claim 2, wherein the first hole is on a lateral side of the light dumper and the second hole is on a lower side of the light dumper.

15. The mask treatment apparatus of claim 2, wherein
the element substrate includes electrodes corresponding to individual micromirrors of the plurality of micromirrors, and
each micromirror of the plurality of micromirrors is configured to be in either an on state, during which light reflected by the micromirror passes through the second hole, or an off state, during which the micromirror is rotated relative to the on state and light reflected by the micromirror is directed to an inner surface of the light dumper without passing through the second hole.

16. The mask treatment apparatus of claim 15, wherein individual micromirrors of the plurality of micromirrors are configured to rapidly switch between the on state and the off state to form various irradiation patterns.

17. The mask treatment apparatus of claim 4, wherein the irradiation position change mechanism includes a Galvano scanner.

* * * * *